(12) United States Patent  
Hannebauer

(10) Patent No.: US 7,977,145 B2  
(45) Date of Patent: Jul. 12, 2011

(54) METHOD OF FABRICATING SILICON/DIELECTRIC MULTI-LAYER SEMICONDUCTOR STRUCTURES USING LAYER TRANSFER TECHNOLOGY AND ALSO A THREE-DIMENSIONAL MULTI-LAYER SEMICONDUCTOR DEVICE AND STACKED LAYER TYPE IMAGE SENSOR USING THE SAME METHOD, AND A METHOD OF MANUFACTURING A THREE-DIMENSIONAL MULTI-LAYER SEMICONDUCTOR DEVICE AND THE STACK TYPE IMAGE SENSOR

(75) Inventor: Robert Steven Hannebauer, Vancouver (CA)

(73) Assignees: Lumiense Photonics, Inc., Vancouver (CA); Hanvision Co., Ltd., Daejeon-Si (KR)

( * ) Notice: Subject to any disclaimer, the term of this patent is extended or adjusted under 35 U.S.C. 154(b) by 0 days.

(21) Appl. No.: 12/045,952

(22) Filed: Mar. 11, 2008

(65) Prior Publication Data

US 2008/0160723 A1 Jul. 3, 2008

Related U.S. Application Data

(63) Continuation of application No. PCT/KR2006/003624, filed on Sep. 12, 2006.

(30) Foreign Application Priority Data

Sep. 13, 2005 (KR) .................. 10-2005-0085417  
May 10, 2006 (KR) .................. 10-2006-0042000

(51) Int. Cl.  
*H01L 21/00* (2006.01)

(52) U.S. Cl. .............. 438/74; 438/67; 438/455

(58) Field of Classification Search ............ 438/57, 438/68–70, 73–75, 455–459, 64, 67, 108  
See application file for complete search history.

(56) References Cited

U.S. PATENT DOCUMENTS 5,523,602 A 6/1996 Horiuchi et al.  
(Continued)

FOREIGN PATENT DOCUMENTS

JP 60117660 6/1985  
(Continued)

OTHER PUBLICATIONS

International Search Report from PCT/KR2006/003624.

*Primary Examiner* — Charles D Garber  
*Assistant Examiner* — Bryan R Junge  
(74) *Attorney, Agent, or Firm* — Brinks Hofer Gilson & Lione

(57) ABSTRACT

Fabrication of a three-dimensional semiconductor structure is provided by the present disclosure. A buffer oxide film, a nitride film, and an ONO dielectric layer are formed on a handle wafer. A semiconductor layer and an oxide film are formed on a donor wafer, which is turned over and is then bonded to a handle wafer. Silicon of the donor wafer is then removed. In the same manner, blue, green, and red diode layers, and a transistor layer are sequentially formed. A metal layer is formed on the transistor layer. Inter-elements contact and pixel separation processes are performed and a support layer is bonded. The whole device is turned over and the nitride film is etched using an etch-stop layer, thus removing the handle wafer. After the elements are separated, packaging is performed to complete the device. Therefore, a back illuminated image sensor of a multi-layer structure can be provided.

10 Claims, 16 Drawing Sheets

U.S. PATENT DOCUMENTS

| | | |
|---|---|---|
| 5,882,987 A | 3/1999 | Srikrishnan |
| 6,150,676 A * | 11/2000 | Sasaki ............................ 257/191 |
| 6,646,289 B1 | 11/2003 | Badehi |
| 6,841,816 B2 | 1/2005 | Merrill et al. |
| 7,060,592 B2 * | 6/2006 | Pan et al. ....................... 438/458 |
| 7,411,620 B2 * | 8/2008 | Taniguchi et al. ............ 348/294 |
| 7,473,614 B2 * | 1/2009 | Tolchinsky et al. ........... 438/407 |
| 2003/0153163 A1 | 8/2003 | Letertre et al. |
| 2004/0060898 A1 * | 4/2004 | Tsai .................................. 216/2 |
| 2004/0203189 A1 * | 10/2004 | Chen et al. ..................... 438/108 |
| 2005/0087829 A1 * | 4/2005 | Merrill et al. .................. 257/440 |
| 2005/0168428 A1 * | 8/2005 | Nakajima et al. ................ 345/99 |
| 2006/0043520 A1 * | 3/2006 | Jerdev et al. .................. 257/462 |
| 2006/0121691 A1 * | 6/2006 | Noguchi et al. ............... 438/455 |

FOREIGN PATENT DOCUMENTS

JP            2004134672       4/2004

* cited by examiner

FIG. 11

| | |
|---|---|
| ONO filter stack(Green reflect) | 133 |
| Donor 2 transfer Si(Green PD) | 131 |
| Donor 2 Thermal Oxide | 132 |
| ONO filter stack(Blue reflect) | 123 |
| Donor 1 transfer Si(Blue PD) | 121 |
| Donor 1 Thermal Oxide | 122 |
| ONO filter stack(AR) | 113 |
| Nitride CMP Stop | 112 |
| Thick Buffer Oxide | 111 |
| Handle Wafer | 110 |

FIG. 13

| | |
|---|---|
| ONO filter stack(All reflect) | 143 |
| Donor 3 transfer Si(Red PD) | 141 |
| Donor 3 Thermal Oxide | 142 |
| ONO filter stack(Green reflect) | 133 |
| Donor 2 transfer Si(Green PD) | 131 |
| Donor 2 Thermal Oxide | 132 |
| ONO filter stack(Blue reflect) | 123 |
| Donor 1 transfer Si(Blue PD) | 121 |
| Donor 1 Thermal Oxide | 122 |
| ONO filter stack(AR) | 113 |
| Nitride CMP Stop | 112 |
| Thick Buffer Oxide | 111 |
| Handle Wafer | 110 |

FIG. 15

| | |
|---|---|
| Donor 4 transfer Si(Transistor) | 151 |
| Donor 4 Thermal Oxide | 152 |
| ONO filter stack(All reflect) | 143 |
| Donor 3 transfer Si(Red PD) | 141 |
| Donor 3 Thermal Oxide | 142 |
| ONO filter stack(Green reflect) | 133 |
| Donor 2 transfer Si(Green PD) | 131 |
| Donor 2 Thermal Oxide | 132 |
| ONO filter stack(Blue reflect) | 123 |
| Donor 1 transfer Si(Blue PD) | 121 |
| Donor 1 Thermal Oxide | 122 |
| ONO filter stack(AR) | 113 |
| Nitride CMP Stop | 112 |
| Thick Buffer Oxide | 111 |
| Handle Wafer | 110 |

METHOD OF FABRICATING SILICON/DIELECTRIC MULTI-LAYER SEMICONDUCTOR STRUCTURES USING LAYER TRANSFER TECHNOLOGY AND ALSO A THREE-DIMENSIONAL MULTI-LAYER SEMICONDUCTOR DEVICE AND STACKED LAYER TYPE IMAGE SENSOR USING THE SAME METHOD, AND A METHOD OF MANUFACTURING A THREE-DIMENSIONAL MULTI-LAYER SEMICONDUCTOR DEVICE AND THE STACK TYPE IMAGE SENSOR

CROSS-REFERENCE TO RELATED APPLICATIONS

This application is a continuation of International Application No. PCT/KR2006/003624 filed on Sep. 12, 2006, which claims the benefit of KR 10-2005-0085417, filed Sep. 13, 2005, and KR 10-2006-0042000, filed May 10, 2006. The disclosures of the above applications are incorporated herein by reference.

FIELD

The present invention relates generally to a semiconductor process and device structures, and more particularly to the fabrication of semiconductor devices having a three-dimensional multi-layer semiconductor structure and a silicon/dielectric multilayer structure and an optical device having a three-dimensional layered device structure.

BACKGROUND

The statements in this section merely provide background information related to the present disclosure and may not constitute prior art.

In the fields of image sensors or optical sensors, a variety of techniques using a sensor capable of sensing photons having an infrared, visible or wide spectrum have been developed. However, not one of the techniques has been applied to mass production of an imaging device that is fundamentally a three-dimensional multi-layer structure capable of sensing signals of many different wavelengths at various layers as an analog of photographic color film.

This before mentioned integration has not been accomplished because each technique has limitations that prevent integration into a three dimensional layered structure, problems such as 1) reduced fill factor (where 100% fill factor means all incident light goes into signal detection) due to the existence of signal processing and transfer circuits taking area away from photon collection, 2) that light of a variety of wavelengths is not sensed at one pixel location (through the use of a Color filter array on a black and white sensor), 3) the ability to independently optimize the collection wavelength filter characteristics from the device structure by using a filter that is integrated into a device and can select specific ranges of wavelengths, 4) solutions to issues with leakage current problems (also known as dark current) in an optical sensor structure that cannot be used in a three dimensional layered structure, and 5) issues with noise cancellation in the sensor because of limited process options or limited circuitry space.

In above-mentioned sensor, the three-dimensional multi-layer structure is required in order to sense various spectrums at one pixel location. However, a complete three-dimensional multi-layer thin film structure has not been successfully commercialized. This is because each previous technique has problems, such as a misalignment between layers, problems caused by using a glass or quartz crystal substrate (and the subsequent thermal coefficient of expansion problems), and the method was unknown as to how to separate semiconductor layers by inserting dielectric between them.

One limiting factor in a traditional planar image sensor; Is that, in order to obtain a color selective output signal from the sensor, a color filter array must be used. The color filter array is patterned across the planar Black and white sensor in various patterns with the Bayer sensor pattern being one of the most common. In this case, a significant part of incident light is lost. In most cases, about $2/3$ of incident light is absorbed and only $1/3$ of incident light is converted into picture information at a given pixel. A sensor having three or more laminated photodiodes can convert the whole light illuminated thereon into picture information like photographic film without subsequent photon loss.

Fill factor refers to the ratio of pixel area in which incoming photons can be collected and converted into signals to the area used for support circuits and semiconducting structures A fill factor of 100% can be obtained using only a full frame CCD. In a sensor having a fill factor of less than 100% the portion that is not used as the image region, of the pixel directly degrades the collecting efficiency of the sensor. In an ILT (interline transfer) CCD the fill factor of less than 100% is due to the vertical transfer semiconducting structure. In a CMOS APS, the region that holds the amplifier and readout transistors and metal interconnects takes away from the light collection area that can be used for the photon detection.

SUMMARY

Disclosure of Invention Technical Problem

An object of the present invention is to provide a method of fabricating a silicon/dielectric multi-layer substrate, in which alignment and/or masking is not required during the fabrication of the multi-layered substrate in the manufacturing process and thus manufacturing time, cost and complexity can be decreased. It should be noted that this technique can be applied to the fabrication of a variety of stack type semiconductor devices. Patterning and definition of structure within the three-dimensional layered structure is down after the substrate is formed in processes that are compatible with modern CMOS FEOL processing.

Another object of the present invention is to provide a method of fabricating a semiconductor device having a multi-layer structure using the above-mentioned fabrication method of the silicon/dielectric multi-layer substrate and device structure thereof.

Further another object of the present invention is to provide a method of fabricating a stack type image sensor using the above-mentioned method of fabricating a semiconductor device having a multi-layer structure, and a structure of a stack type image sensor thereof.

Still another object of the present invention is to provide a multiple spectral wavelength discriminating image sensor, in which several wavelength bands can be detected at one pixel location in fabricating an image sensor, wavelength bands can be controlled independently from the rest of the process (does not rely on inherent properties), the leakage current at an optical detection portion can be minimized, KTC noise can be reduced greatly or eliminated, the fill factor of each sensed pixel can be optimized, and an area for implementing a signal processing circuit can be maximized.

Technical Solution

The present invention can fabricate a semiconductor substrate by slightly modifying the basic concept of transfer technology in order to meet the object of the present invention. A work substrate in which no patterns or structures are formed is used.

An embodiment of the present invention provides a method of fabricating a silicon/dielectric multi-layer thin film using the following layer transfer method.

A method of fabricating a silicon/dielectric multi-layer thin film for a semiconductor device of a silicon/dielectric multi-layer structure includes a step of preparing a handle wafer; a donor wafer preparation step for layer transfer, of forming a semiconductor layer in a donor wafer; a layer transfer step of turning over the donor wafer so that the donor wafer is bonded to a top surface of the handle wafer, whereby the semiconductor layer remains but the remaining donor wafer is removed through layer transfer; a step of forming a dielectric layer on the handle wafer on which the layer transfer has been performed (the dielectric being formed on the newly transferred layer above the handle wafer to which it is bonded); and a step of repeating the donor wafer preparation step, the layer transfer step, and the dielectric layer formation step, thus forming a multi-layer silicon/dielectric layer stack.

A method of fabricating a silicon/dielectric multi-layer thin film in the related art generally uses an epitaxial deposition method. The epitaxial deposition method are disadvantageous in terms of time and cost, and silicon is cannot epitaxially grow on dielectric without some form of seed layer of crystalline Silicon. For this reason, the fabrication of devices of a silicon/dielectric multi-layer thin film structure is inefficient and is difficult to apply to mass production.

Accordingly, the method of fabricating the silicon/dielectric multi-layer thin film according to an embodiment of the present invention solves the prior art problems. If the method of the present invention is used, semiconductor devices having a multi-layer thin film structure can be mass-produced.

In the step of preparing the handle wafer, a dielectric layer is formed on the handle wafer, the layer transfer step is performed onto the dielectric layer. That is, although the handle wafer itself may be prepared, the dielectric layer may be further formed on the handle wafer.

In the donor wafer preparation step, after another dielectric layer is formed on the donor wafer, one or more doped semiconductor layer(s) is/are formed. In other words, though the donor wafer can be prepared by forming the doped semiconductor layer in the donor wafer, the donor wafer may be prepared by forming the dielectric layer on the donor wafer and then forming the doped semiconductor layer below the dielectric layer. Such doping is accomplished using standard implant steps, chained implants and/or blanket chained implant steps.

The dielectric layer includes any one of an oxide film, a nitride film, and an ONO filter stack layer, or a combination of them. The dielectric layers can also contain various oxides such as Tantalum oxide, aluminum oxide. The only constraint on the material is compatibility to the foundry processes and subsequent thermal processing steps.

Another object of the present invention provides a three-dimensional multi-layer semiconductor device fabricated using the method of fabricating the device of the silicon/dielectric multi-layer thin film structure.

The three-dimensional multi-layer semiconductor device according to an embodiment of the present invention includes an upper layer in which a semiconductor layer dedicated to transistors is formed; and lower layers having a three-dimensional structure in which silicon and dielectric are laminated in multiple layers which are intended for simpler structures such as photodiodes.

In other words, a multi-layer structure of a lower layer and an upper layer is fabricated using a layer transfer method by the method of fabricating the device of the silicon/dielectric multi-layer structure. The multi-layer structure includes the transistor semiconductor layer formed at the highest layer and one or more semiconductor layers having silicon/dielectric laminated thereon, which are formed at the lower layer.

The lower layer structure is not limited to the formation of photodiode layers as in an embodiment of the present invention, but can also be used as the semiconductor layer for other elements formed to constitute the multi-layer structure and a transistor layer. This is integrally formed with the semiconductor layers of the multilayer structure. The transistor layer structure transfer method need not be different than the other layers; the only difference n this structure is that accessibility to BEOL implants as in a normal processing flow.

The lower layer may have a multi-layer structure having a semiconductor junction or a MEMS structure.

Furthermore, the upper layer may be used as an upper layer in the manufacturing process and used as a bottom layer while in use. Thus facilitating a back-side illuminated structure.

Furthermore, the present invention provides a method of fabricating a silicon/dielectric multi-layer semiconductor device. The present invention provides two kinds of structures.

The first method includes forming a lower layer using the silicon/dielectric multi-layer thin film lamination method and forming a transistor at the highest layer, thus forming an upper layer. In this case, the structures are from-side illuminated with subsequent loss of fill factor.

In the case where the multi-layer semiconductor device constructed as above is comprised of a front-side illuminated image sensor, a metal layer is formed on the transistor and a contact step for pixel separation and circuit connection of the transistor and each semiconductor layer is performed. The whole device is packaged using standard wire bonding and packaging techniques with the handle forming the mounting substrate like standard Silicon die mounting methods.

The second method includes forming solder bumps, attaching a support layer on the solder bumps, turning over the whole device in order to remove a handle wafer, and packaging the whole device mounted to this support layer. Thus facilitating back-side illumination in the step of preparing the handle wafer in order to remove the handle wafer, a buffer oxide film, a nitride film, and a dielectric layer are formed on the handle wafer and the nitride film is used as an etch-stop layer of the handle wafer.

A method of fabricating an image sensor using the semiconductor device of the three-dimensional multi-layer structure according to the first method includes a handle wafer preparation step of sequentially forming a buffer oxide film and a dielectric layer on a handle wafer, thus preparing a work substrate; a donor wafer preparation step of forming a semiconductor layer for the semiconductor device in a donor wafer and preparing the donor wafer for layer transfer; a layer transfer step of turning over the donor wafer, bonding the turned-over donor wafer to a top surface of the work substrate, and removing a silicon layer of the remaining donor wafer except for the semiconductor layer transferred by layer transfer; a dielectric layer formation step of forming a dielectric layer on a top surface after the layer transfer step; a multi-layer structure formation step of repeating the donor wafer preparation step, the thin film layer transfer step, and the dielectric layer formation step, thereby laminating silicon and dielectric of a multi-layer structure on the handle wafer; and a step of forming the highest layer of the semiconductor layer on which the layer transfer has been performed as a transistor layer, completing a transistor, connecting the transistor to semiconductor layers of an underlying multi-layer structure, separating pixels, forming solder bumps, and performing flip-chip packaging on a support wafer.

In the above, the semiconductor layer of the multi-layer structure may be formed to have a variety of shapes. However, in the case of color image acquisition of a general visible wavelength region, a three-layer photodiode layer maybe formed and a transistor layer may be then formed at the highest layer, forming the image sensor. In this case, the dielectric layer is an ONO filter stack and is formed using a color selection layer of each color layer of the image sensor.

Furthermore, a method of fabricating an image sensor according to the second method includes a handle wafer preparation step of forming an etch-stop layer and a dielectric layer on a handle wafer; a donor wafer preparation step of forming a semiconductor layer for the semiconductor device in a donor wafer and preparing the donor wafer for layer transfer; a layer transfer step of turning over the donor wafer, bonding the turned-over donor wafer to a top surface of the work substrate, and removing a silicon layer of the remaining donor wafer except for the semiconductor layer through layer transfer; a dielectric layer formation step of forming a dielectric layer on a top surface of the work substrate after the layer transfer step; a multi-layer structure formation step of repeating the donor wafer preparation step, the layer transfer step, and the dielectric layer formation step, thus forming silicon/dielectric in a multi-layer structure; a pixel separation and contact step of forming the highest layer of the semiconductor layer as a transistor layer, completing transistors, allowing the transistors to bring in contact with semiconductor layers of an underlying multi-layer structure, separating pixels in the semiconductor layer of the multi-layer structure, and forming a metal layer and solder bumps on an upper surface; a support layer preparation step of preparing a support layer and forming an oxide film and a metal layer in which circuits are patterned on the support layer; a support layer bonding step of turning over the support layer and aligning and bonding the solder bumps and the metal layer; and a handle wafer removing step of turning over the support layer so that the support layer is located at a lower side, etching the handle wafer using an etch-stop layer, removing the etch-stop layer, and then performing dicing and packaging.

That is, in the three-dimensional image sensor fabricated using the second method according to the present invention, the transistor layer as the semiconductor layer is formed at the multi-layer photodiode layer and the highest layer. Each dielectric layer includes an ONO filter stack used as an AR coating film formed on the handle wafer. A dielectric layer between the photodiode layers includes an ONO filter stack formed as each color selection layer. Each dielectric layer is attached to the support layer. The handle wafer is removed using the nitride film as the etch-stop layer. The three-dimensional image sensor includes a back illuminated image sensor.

In the silicon/dielectric multi-layer semiconductor substrate, a MOS semiconductor structure is formed at the highest layer of a three-dimensional semiconductor circuit.

The MOS semiconductor may include a transistor fabricated using a bulk semiconductor process and the MOS semiconductor may include a SOI Si transistor that is partially or entirely depleted.

Furthermore, the MOS semiconductor may include a Junction Field Effect Transistor (JFET) that is completely isolated by dielectric. The MOS semiconductor may include either a Bipolar Junction Transistor (BJT) that is completely isolated by dielectric or a flip-fet transistor that is completely insulated by dielectric.

Furthermore, the transistor formed may include a transistor having four terminals, including a source, a drain, a top side gate, and a back side gate that is independent of other transistors.

Furthermore, the MOS semiconductor is packaged using a flip-chip scheme.

As described above, a stack type photo image sensor can be provided using the method of fabricating the silicon/dielectric multi-layer device according to an embodiment of the present invention.

The stack type image sensor according to an embodiment of the present invention can be constructed to selectively sense a variety of wavelength bands. The stack type image sensor may include, for example, a blue photodiode formed to a predetermined thickness with no filter above; a first oxide layer provided on the blue photodiode; a green photodiode formed on the first oxide layer and formed to a predetermined thickness using silicon; a second oxide layer provided on the green photodiode; a red photodiode formed on the second oxide layer and formed to a predetermined thickness using silicon; a third oxide layer provided on the red photodiode; and a transistor layer formed on the third oxide layer and having formed a transistor therein.

Optical filters for helping to select colors of each photodiode are provided on and below each photodiode. With a blue reflect layer being formed on the blue diode, green reflect on the green and a red reflect being formed on the red photodiode. A Ir reflect layer can be formed also on the red reflect layer.

The optical filter is formed using an ONO filter stack. Or other materials as is deemed necessary and compatible. The image sensor is packaged in a flip-chip manner.

Advantageous Effects

As described above in detail, a semiconductor device according to the present invention can provide a back illuminated sensor of a multi-layer silicon structure having a wavelength selective reflecting layer between detecting layers. It is considered that the image sensor fabricated by the method according to the present invention is the best solution that can accomplish the above objects.

The process of the present invention may be used to fabricate a variety of sensors ranging from a general sensor to a high-performance optical sensor with greatly reduced noise. The present invention is advantageous in that it can fabricate an electronic camera without a reduction in the fill factor or anti-blooming performance in the SLR sensor. The present invention is also advantageous in that it can couple a sensor to a digital processing chip (the mount wafer, with solder bumps, can be an active wafer not just a holder/mount wafer) while accomplishing a high degree of integration, low-power, and miniaturization in a bulky sensor.

Furthermore, the present invention is advantageous in that it can be applied to the fabrication of a sensor with a very small pixel. The present invention is also advantageous in that it can accomplish a high degree of video performance, which can be obtained only in a CCD, using a global parallel shutter operation inherent in the sensor according to an embodiment of the present invention.

In the process according to the present invention, general silicon processing techniques, equipments, and factories are used without special equipment. This enables each process to be optimized and performed independently. This is because the formation of the photodiode, the connection and contact of the photodiode, the transistor process, and the metal stack process do not affect the other or are not coupled together.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

In order that the invention may be well understood, there will now be described an embodiment thereof, given by way of example, reference being made to the accompanying drawing, in which:

FIGS. 6 to 22 are process flows illustrating a method of fabricating a three-dimensional multi-layer semiconductor device according to an embodiment of the present invention.

DETAILED DESCRIPTION

The following description is merely exemplary in nature and is not intended to limit the present disclosure, application, or uses.

A layer transfer process used in the present invention will be first described in brief below with reference to FIG. 1.

Figure 1:
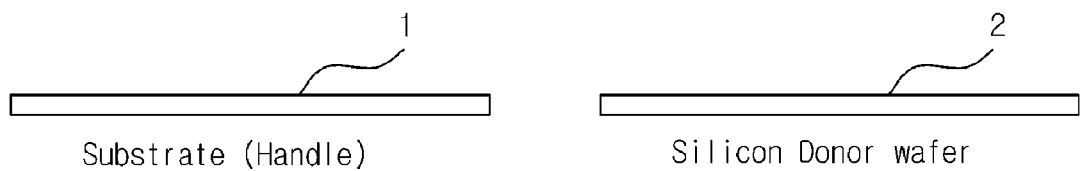
FIGS. 1 to 5 are explanatory views illustrating one possible layer transfer process to which the present invention is applied.
Figure 2:
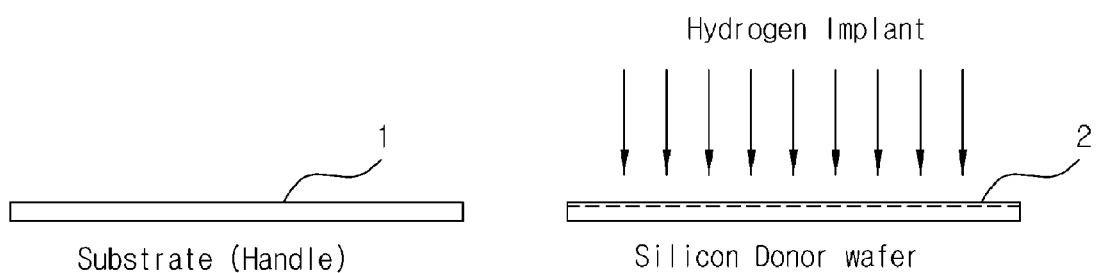

Referring to FIG. 1, a handle wafer 1 is prepared on the left side and a donor wafer 2 is prepared on the right side. A hydrogen implant process is performed on the donor wafer 2 at a predetermined depth, as shown in FIG. 2. The hydrogen implant weakens the silicon wafer at depth. More particularly, if a hydrogen concentration within silicon exceeds the hydrogen solid solubility a large quantity of hydrogen initiated microplatelets or voids serves as an separation center in the wafer cut process.

Figure 3:
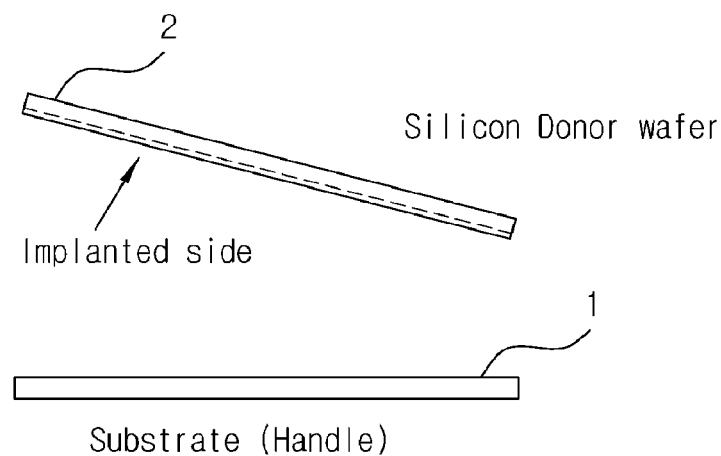
Figure 4:
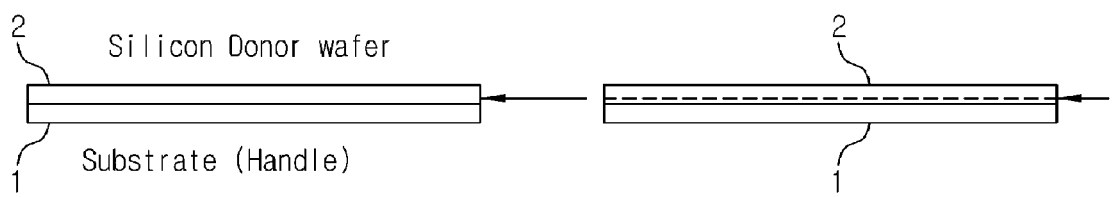

Thereafter, as shown in FIG. 3, the donor wafer 2 is flipped over onto handle wafer 1. At this time, the implanted surface is brought in contact with the handle wafer 1. The two wafers are bonded together as shown in FIG. 4. Though not shown in the drawing, the bonding process may be enhanced using plasma activated bonding. Once the bonding process of the wafers is completed, a bonding force corresponding to 80% of the covalent bonding force is formed between both the wafers.

Figure 5:
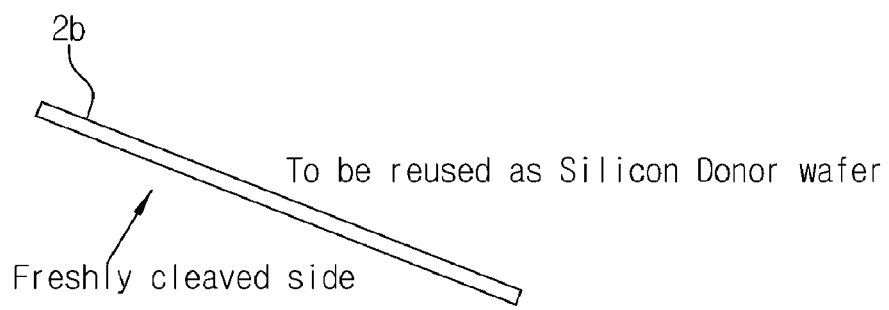

Once the bonding process of the two wafers is completed, a thermal treatment process is performed on the bonded wafers. As a result of the thermal treatment process, hydrogen gathers within silicon and the two wafers are separated into two parts as the donor wafer 2 is cut along the crystalline plane, as shown in FIG. 5. The separated donor wafer may be used once again through a polishing process, a silicon oxide layer formation process, a cleaning process, and so on.

In the above, a Smartcut process in which hydrogen is implanted to facilitate the layer transfer process has been described as an example only. The layer transfer method may also include the Nano-Cleave technique proposed by SiGen Corporation, in which a Si layer and a SiGe layer are formed in the donor wafer. In this case, a thin film may be formed using a Si-EPI deposition method instead of the formation of the thermal oxide film and the hydrogen implant process so that only the Si layer experiences room temperature junction transfer. Furthermore, the oxide film in the hydrogen implant method may be formed in the work substrate in advance via the SIMOX process.

In an embodiment of the present invention, a method of performing layer transfer by implanting hydrogen will be described as an example.

A method of fabricating a silicon/dielectric multi-layer structure of a multi-layer semiconductor device using the above-mentioned layer transfer method may be performed as follows.

A handle wafer is first prepared. A doped semiconductor layer is formed in a donor wafer via chained implants of various conductivity types. The donor wafer is prepared by performing a process for layer transfer. The donor wafer is turned over and is then bonded to a top surface of the handle wafer. A layer transfer process is then performed to separate and remove the donor wafer with the semiconductor layer being left. Thereafter, a dielectric layer is formed on a top surface of the handle wafer in which the semiconductor layer remains. This can then be subsequently blanket chain implanted to finish the formation of semiconducting structure before subsequent layer transfers.

As described above, the silicon/dielectric semiconductor device of the multi-layer structure is fabricated by the method of preparing the donor wafer in which the semiconductor layer is formed, performing layer transfer, and then forming the dielectric layer on the transferred film. With implants before and after the transfer process.

In the process of preparing the handle wafer, after the dielectric layer is formed on the handle wafer, a semiconductor layer may be stacked on the dielectric layer using the donor wafer through layer transfer and a dielectric layer may be then formed on the semiconductor layer again. And the process repeated to build up a multilayer structure with as many layers as necessary.

Furthermore, in the process of preparing the donor wafer, after a dielectric layer is formed on the donor wafer, a doped semiconductor layer is formed. That is, a dielectric layer formed on a doped donor wafer is further included.

Therefore, the dielectric layer may be a single layer or a plural layer. For example, the dielectric layer may have a plural layer, such as "oxide film+ONO multi-layer dielectric layer", "oxide film+nitride film+ONO multi-layer dielectric layer", or the like. And the doping can in turn also have multiple polarities and depths depending upon the doping recipes.

A method of fabricating the semiconductor device of the silicon/dielectric multi-layer structure formed using the above-described method will be described below.

A process of preparing a handle wafer by forming a buffer oxide film and a nitride film dielectric layer on the handle wafer is first performed.

Figure 6:

Referring to FIG. 6, a handle wafer 110 is prepared using a lower cost silicon substrate.

Figure 7:
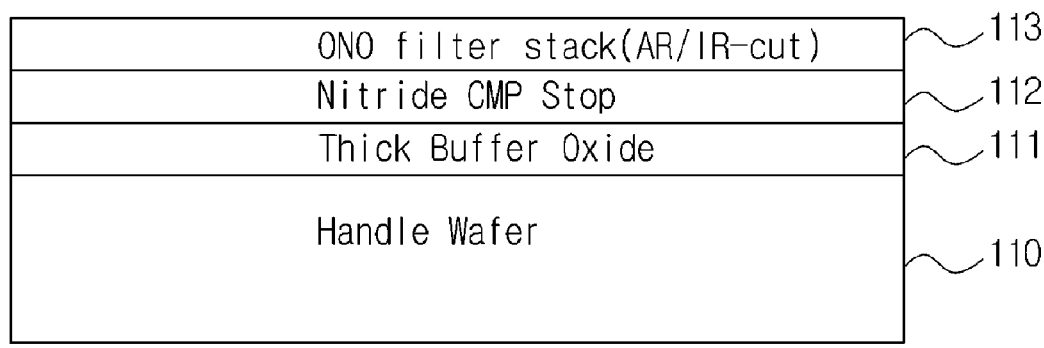

Thereafter, as shown in FIG. 7, a thick buffer oxide film 111 serving as a buffer layer between the handle wafer and a layer transferred in a subsequent process is formed. The buffer oxide film 111 serves to eliminate stress from the transferred layer.

A nitride (nitride CMP-stop) film 112 is deposited on the buffer oxide film 111. The nitride CMP-stop film 112 serves to preclude/stop an etching process in the process of removing the work substrate in the later part of the process and also serves as a barrier to prevent the layer transferred from the work substrate from being contaminated by the inexpensive substrate.

In the case of an image sensor fabricated by the above-mentioned first method, it is not necessary to form the nitride CMP-stop film 112. In addition, in the case where the image sensor is fabricated by the second method, silicon with good semiconductor properties, etc. may be used.

As shown in FIG. 7, an ONO multi-layer dielectric layer (ONO filter stack or Anti-Reflection (AR) coating film) 113 is formed on the nitride CMP-stop film 112. The ONO filter stack serves as an AR coating film of a last image element. That is, the ONO filter stack serves as the AR coating film of a portion on which light is illuminated when it is fabricated as the image sensor and back-side illuminated. The filter layer may be implemented using an IR-cut filter, if appropriate.

While the work substrate experiences a variety of coating processes as mentioned earlier, a process of preparing a first donor wafer is performed. The first donor wafer 120 is prepared by forming a blue diode layer 121 and forming a dielectric film, such as a thermal oxide film, on the blue diode layer 121. At this time, a dielectric film may be formed on the handle wafer instead of the thermal oxide film depending on the layer transfer technique. The thermal oxide film facilitates wafer bonding upon layer transfer.

$H^+$ is then implanted at a predetermined depth in line with a thickness of the thin film in which $H^+$ will remain for the purpose of the layer transfer process. In other words, after the dielectric film, such as the thermal oxide film, is formed on the donor wafer, a P-N-P or N-P-N photodiode layer is formed on the donor wafer through ion implant.

Figure 8:
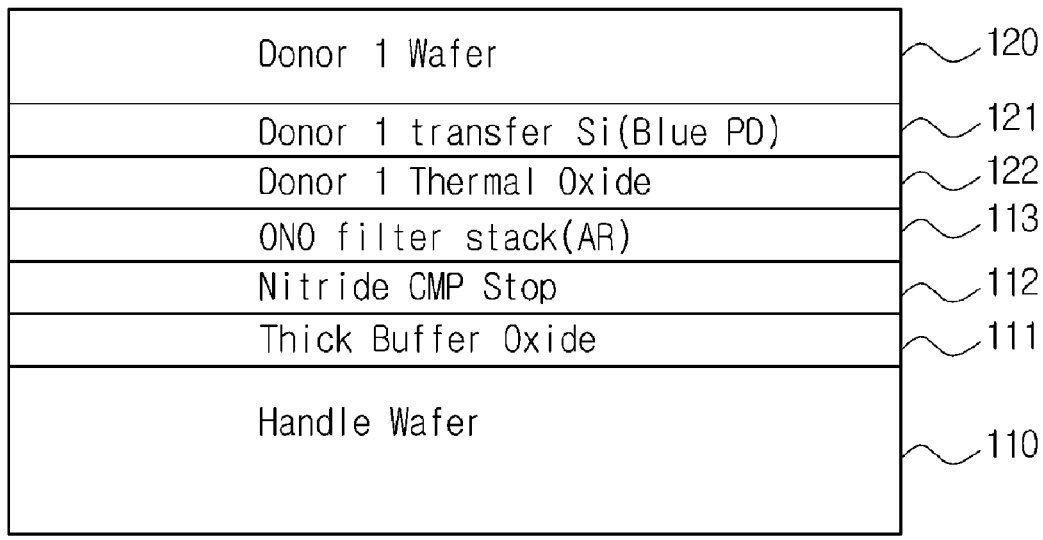

Thereafter, the layer transfer process is carried out. As shown in FIG. 8, a first donor wafer 120 is turned over and then bonded to the handle wafer 110 (i.e., the work substrate) and its subsequent applied layers. The first donor wafer 120 stabilizes the wafers during bonding between Si and.

Figure 9:
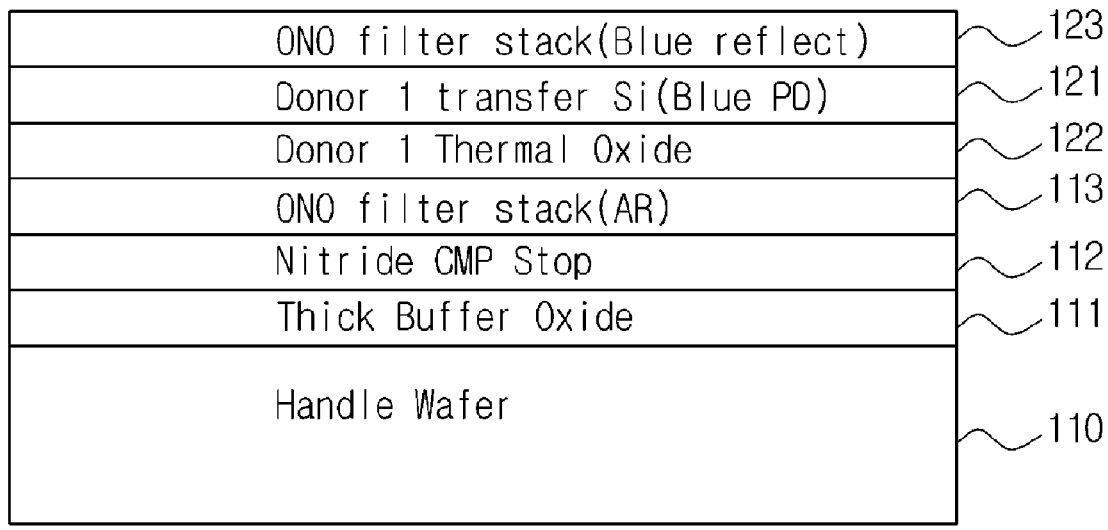

In the bonding process, the silicon layer transferred from the first donor wafer 120 is separated by layer transfer and the blue diode layer 121 (i.e., the transferred film) remains, as shown in FIG. 9. The first donor wafer 120 is bonded to the handle wafer 110 (i.e., the work substrate), the blue diode layer 121 (i.e., transfer film) and the thermal oxide film 122 remain, and the silicon layer of the remaining donor wafer is removed. Implants can be performed at this step with e application of appropriate screen oxides.

An ONO multi-layer dielectric layer (or ONO filter stack (blue reflect)) 123 is formed on the transfer film 121, thus forming a blue reflect layer. This structure is shown in FIG. 9.

In the present embodiment, an example in which the reflect filter is used as the ONO multi-layer dielectric layer has been described. However, the present embodiment is not limited to this purpose, but may use an optical filter for selecting a specific color. That is, the optical filter employing the ONO multi-layer dielectric may be basically used as transmittance, absorption or reflection on a wavelength basis. In the present invention, a reflection characteristic will be described as a reference. Spectra of a wavelength of a corresponding color that has not been absorbed in the diode layer is reflected from the reflect layer and is then sensed by a corresponding diode, thereby improving a wavelength sensing characteristic and effective optical depth.

During the process, a second donor wafer 130 experiences a preparation process of implementing a green photodiode layer 131. Layer transfer for forming the green photodiode layer 131 is then carried on the work substrate.

Figure 10:
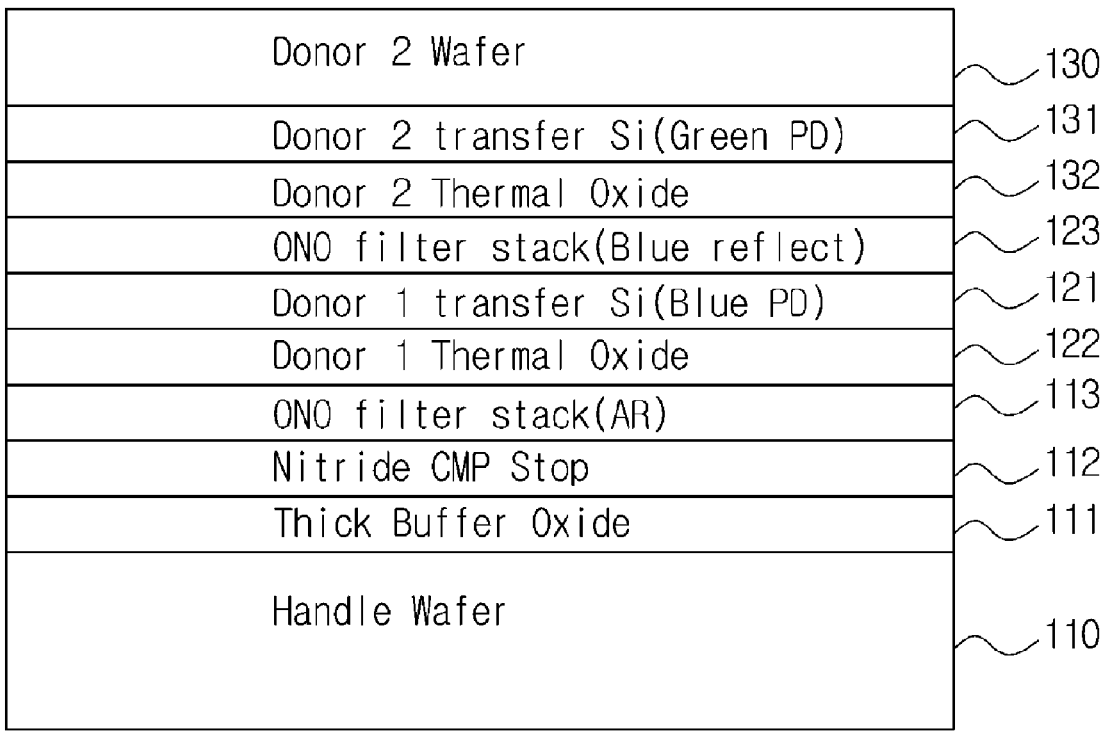

Referring to FIG. 10, the silicon layer is separated from the second donor wafer 130 and is then transferred. Once the layer transfer is completed, a thermal oxide film 132 of the second donor wafer 130 and the blue reflect layer 123 formed on the work substrate are bonded together.

The transferred silicon layer is separated through the bonding of the second donor wafer 130. An ONO multi-layer dielectric film 133 is formed on the green photodiode layer 131, resulting in a green reflect layer. This structure is shown in FIG. 11.

Figure 12:
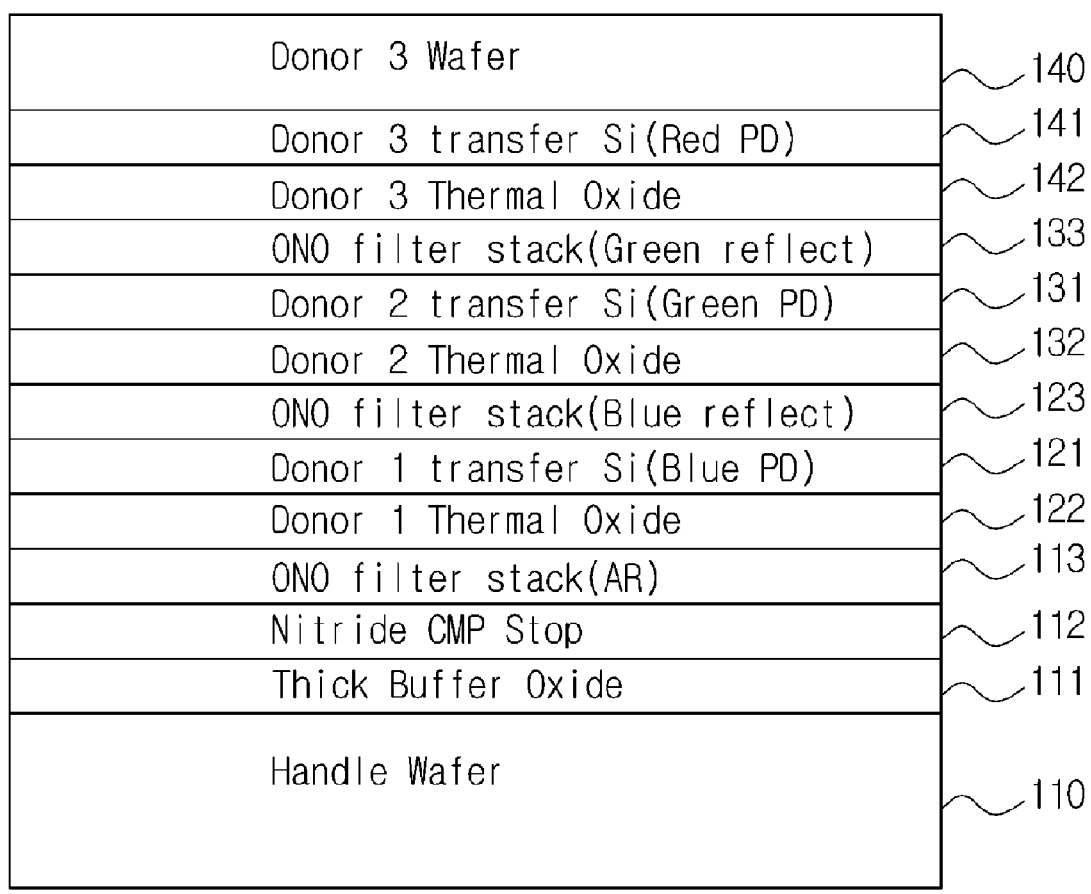

Thereafter, the above-mentioned process is repeated again for a red photodiode. This structure is shown in FIG. 12. That is, a red photodiode layer 141 is formed on a third donor wafer 140. Once the third donor wafer 140 is turned over and then bonded on the work substrate, it is bonded to the thermal oxide film 142. The silicon layer is separated and only the red photodiode layer 141 (i.e., transferred film) remains through the transfer of the third donor wafer 140. An ONO multi-layer dielectric film 143 is formed on the red photodiode layer 141, resulting in a structure as shown in FIG. 13. In other words, once the layer separation process and other processes are completed, an almost complete semiconductor substrate as shown in FIG. 13 is obtained.

Figure 14:
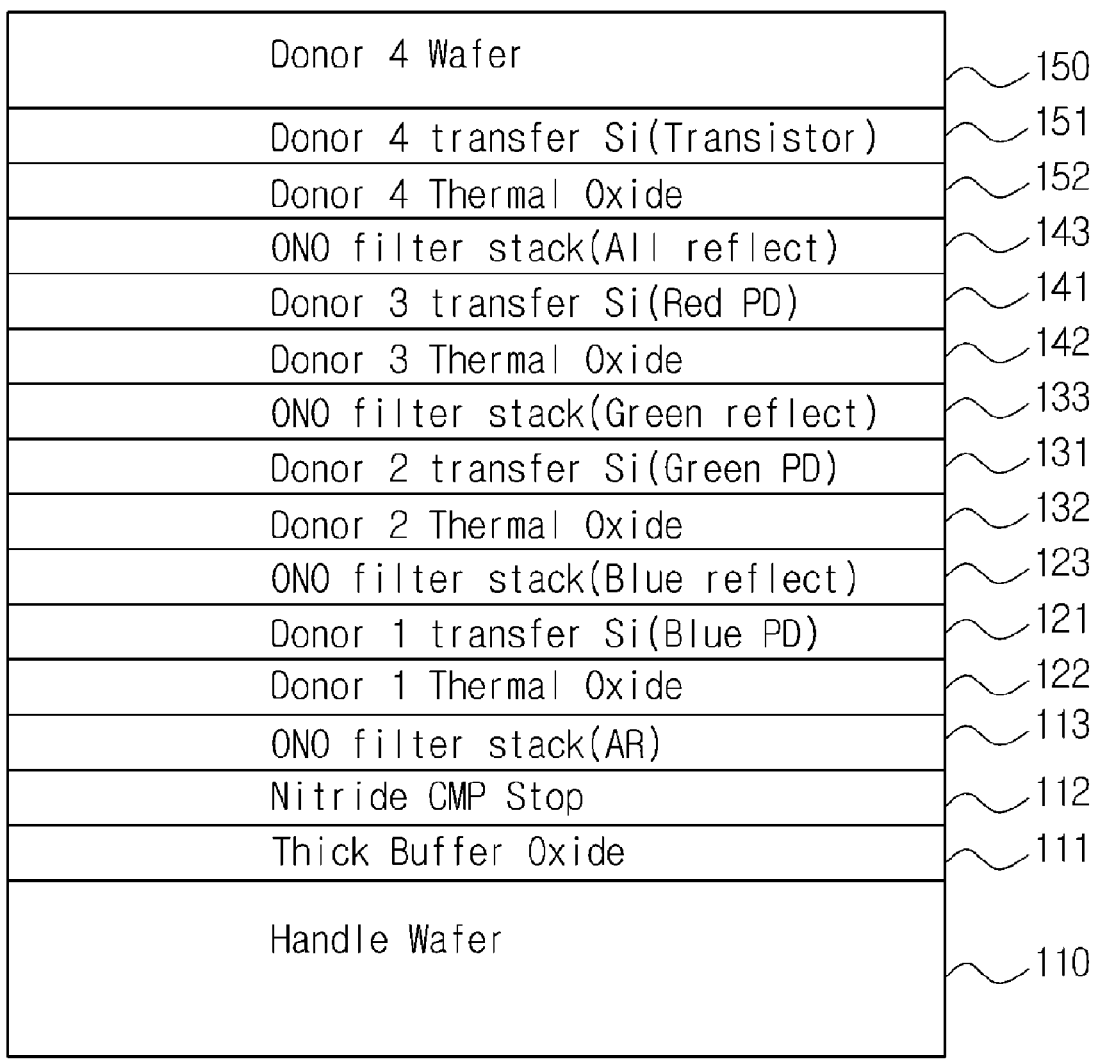

As shown in FIG. 14, a layer for a transistor layer 151 is formed on a fourth donor wafer 150. The thin film is turned over and then bonded to the work substrate on which the process has been completed. Therefore, the thermal oxide film 152 and the ONO multi-layer dielectric film 143 (i.e., red reflect layer) are bonded and the silicon layer is separated through transfer, resulting in the semiconductor device as shown in FIG. 15. At this time, the red reflect layer is not limited to red, but may be formed to operate as a reflect layer that reflects the whole light.

In other words, through the last layer transfer, a layer in which a transistor will be formed is formed. In order to obtain a gate oxide film of a high quality and a transistor of a good quality, special care must be taken to increase the purity of silicon. After the fourth donor wafer 150 is bonded to the work substrate as shown in FIG. 14, the substrate of the structure as shown in FIG. 15 is completed through layer separation and a post-treatment process. In this substrate, the work substrate may have a thickness of 750μ, each photodiode may have a thickness of 500 nm to 1μ, and the ONO dielectric film may have a thickness of about 500 nm.

The transistor layer forms a MOS semiconductor structure. The MOS semiconductor may be formed using a transistor fabricated by a bulk semiconductor process. The MOS semiconductor may also be formed using a SOI Si transistor that is partially or entirely depleted.

Furthermore, the MOS semiconductor may be formed using a Junction Field Effect Transistor (JFET) that is completely isolated by dielectric, a Bipolar Junction Transistor (BJT) that is completely isolated by dielectric, or a flip-fet transistor that is completely insolated by dielectric.

In addition, the transistor may be a transistor having four kinds of terminals, such as a source, a drain, a top side gate, and a back side gate.

A complete wafer in which the transistor is formed is formed, the stacked photodiodes are brought in contact with one another, and one pixel is formed through an inter-pixel separation process. In this case, description about the connection of the photodiode and the transistor, the inter-pixel separation process, and so on will be omitted.

Figure 16:
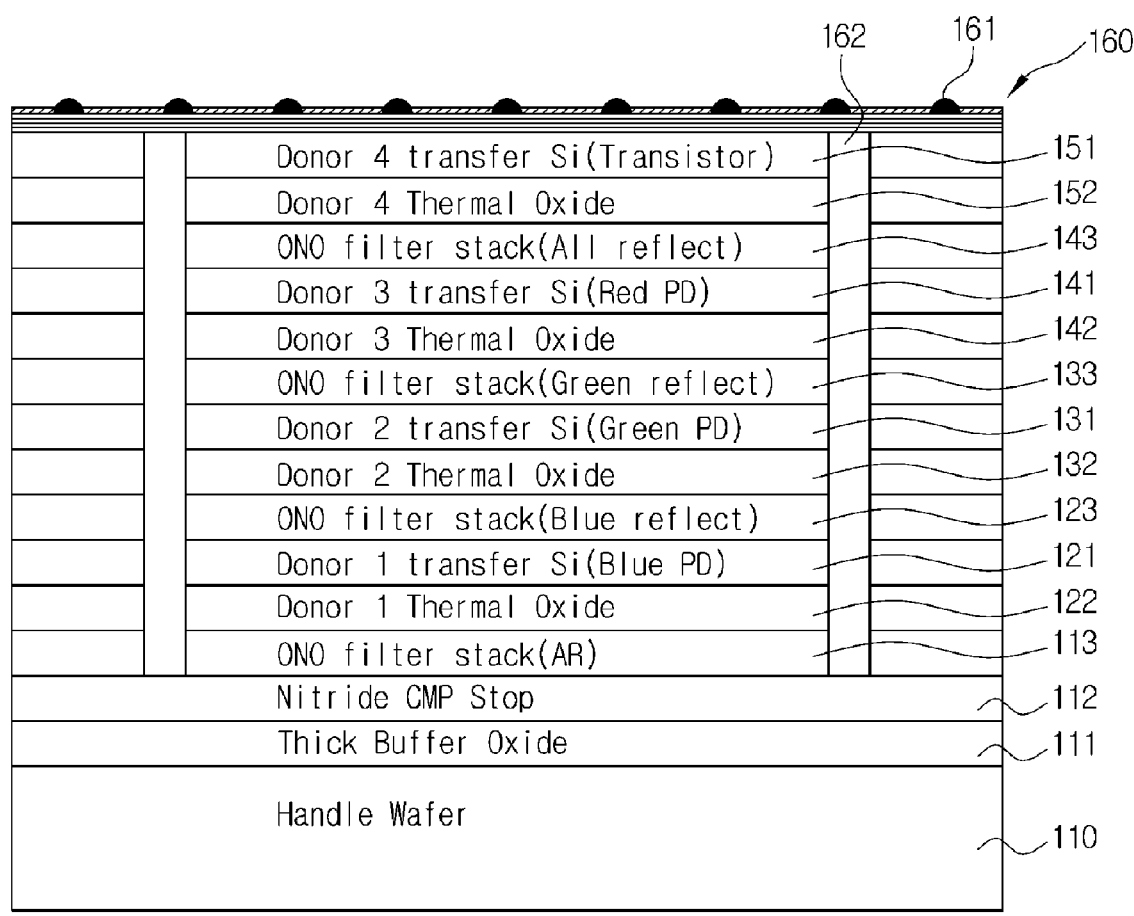

Thereafter, as shown in FIG. 16, a contact process between the stack elements and the inter-pixel separation process are performed in the structure as shown in FIG. 15. Vertical trenches 162 for separating chips are formed. A layer (hereinafter, referred to as "metal layer") 160 on which an Inter Layer Dielectric (ILD) film, a metal layer, and more Back-End-Of-The-Line (BEOL) processes are performed to form a multilayer metal and ILD stack that is a standard BEOL stack for CMOS processing is formed. Thereafter, for the purpose of packaging of the wafer size, solder bumps 161 are formed. The vertical trenches 162 are inserted into the wafer in order to separate respective elements in subsequent processes.

Because the handle wafer is a silicon substrate and because silicon blocks light when a sensor is a back illuminated structure, the work substrate must be removed. In the above, the formation of the transistor and the whole BEOL have been described as one step with reference to FIG. 16. This is because a solution for mounting chips using flip-chip bonding can be sought and a substrate fabrication method using the same can be provided.

The vertical trenches 162 guide a location to be sawed. Once the work substrate is removed, the remaining structure does not withstand large mechanical forces. It is therefore necessary to reinforce mechanical force of the sensor and also to couple a support substrate for transferring a signal from a bumped wafer to the periphery to be bumped later on the wafer.

Figure 17:
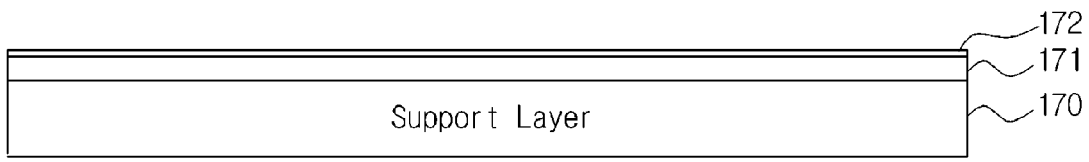

Referring to FIG. 17, a dielectric insulation film 171 is formed on the support layer 170. A patterned metal layer 172 is formed on the dielectric insulation film 171. The metal layer may have a multi-layer structure, if appropriate. Also, this support structure can also be an active electronic device with analog and digital devices on die.

Figure 18:
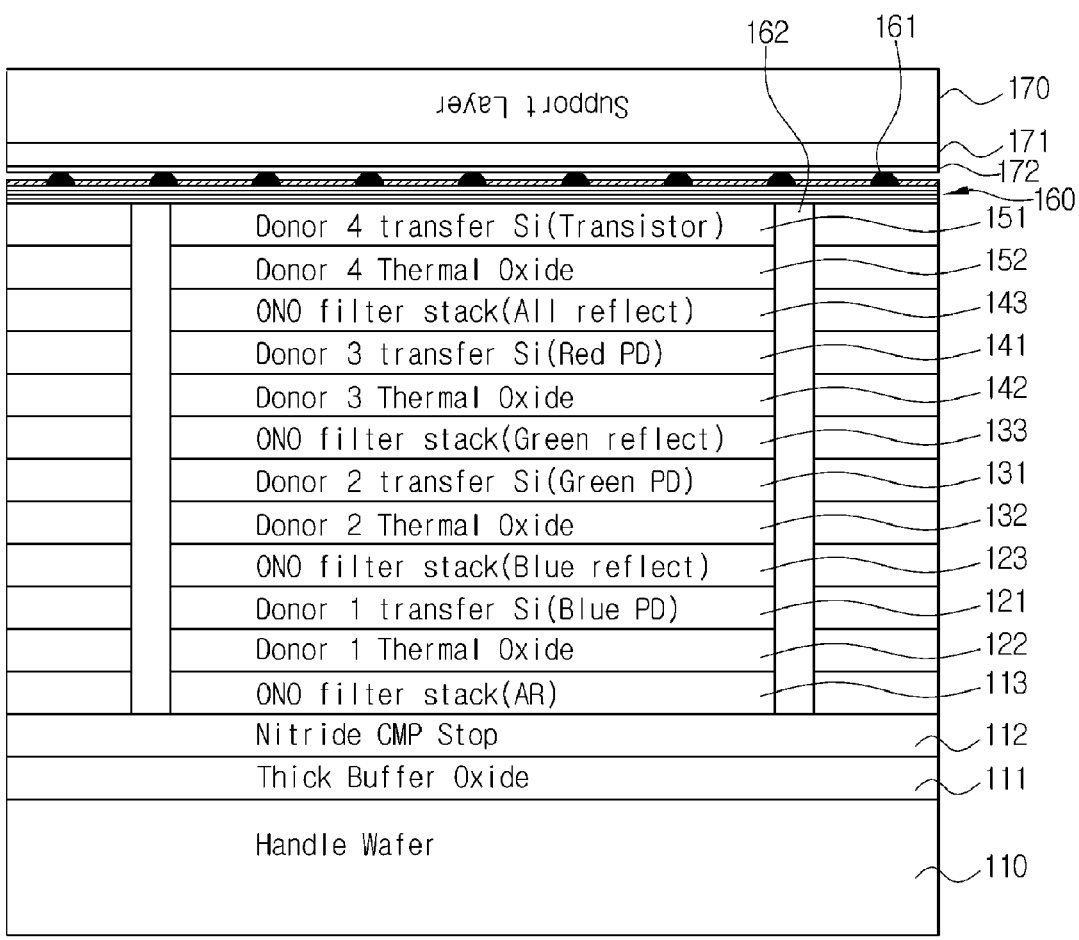

The support layer 170 is turned over and the patterned metal layer 172 is thus bonded to the solder bumps 161. The patterned metal layer 172 is bonded to the support layer 170 through a reflow process of a solder bump. As a result, the sensor has a structure as shown in FIG. 18. At this time, spaces in which the solder bumps 161 exist are sealed in order to protect them from chipping, etc. when silicon is cut. Once the support layer is adhered through the reflow process, preparation for a next process is completed. The substrate is then turned over for a subsequent process.

Figure 19:
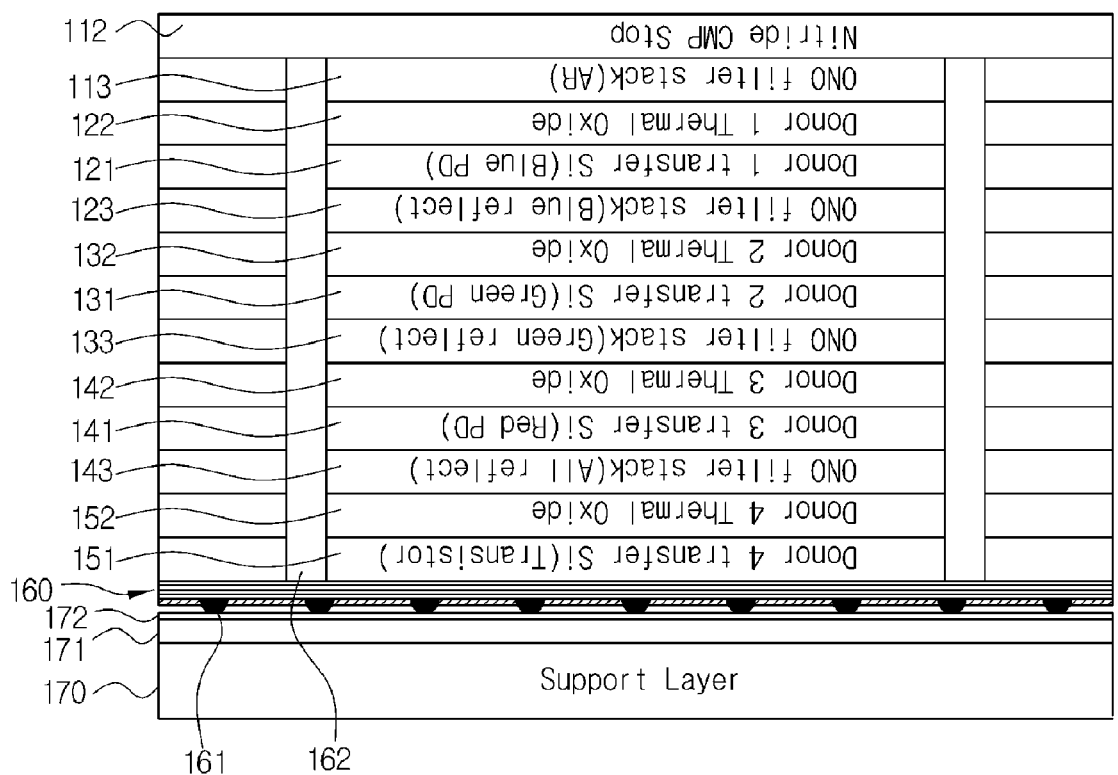

Referring to FIG. 19, the work substrate is removed through CMP and chemical etching process. At this time, the nitride CMP-stop film 112 serves as a stop layer, so that the handle wafer 110 and the buffer oxide film 111 are removed. The nitride CMP-stop film 112 is then removed. Thereafter, though not shown in the drawing, an edge sealing process is performed in order to protect the solder bumps 161.

Figure 20:
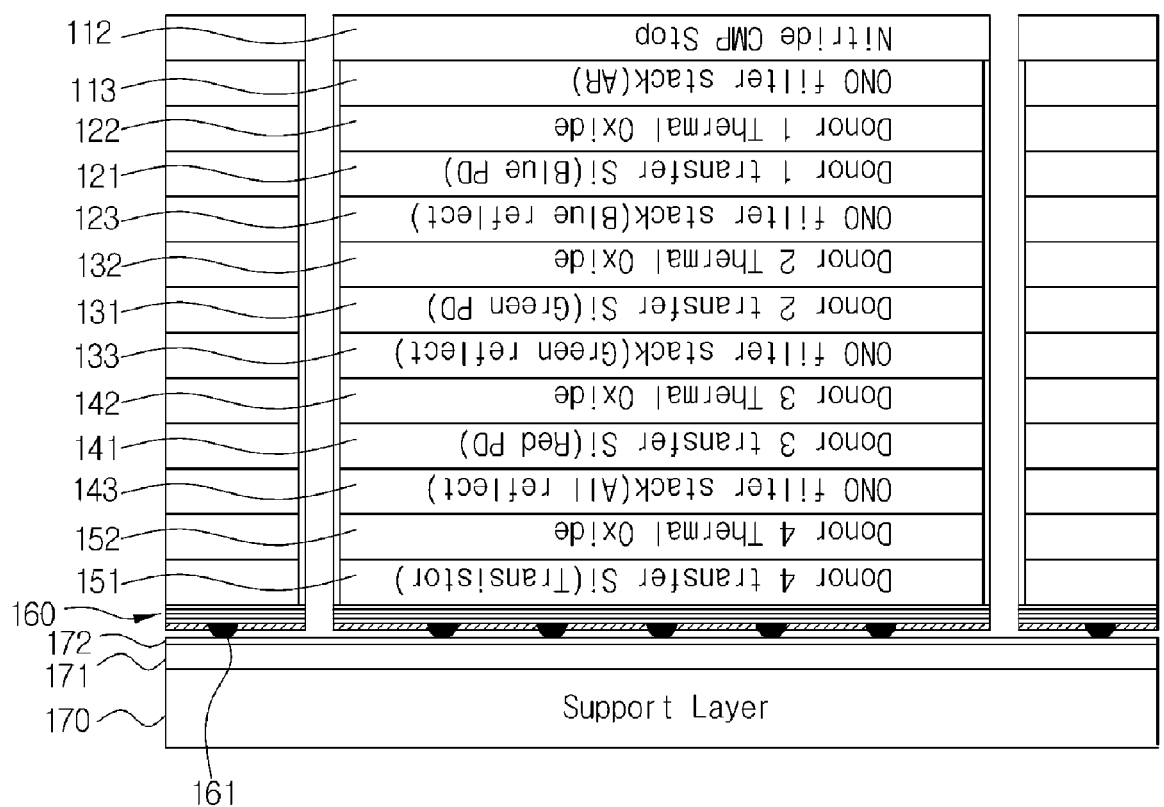

In a die separation process, oxide trenches are removed using one or two sawing operations (in general, when using a laser cutter, the oxide trenches can be removed without forming the vertical trenches additionally). The wafer of a structure as shown in FIG. 20 is thereby obtained.

Figure 21:
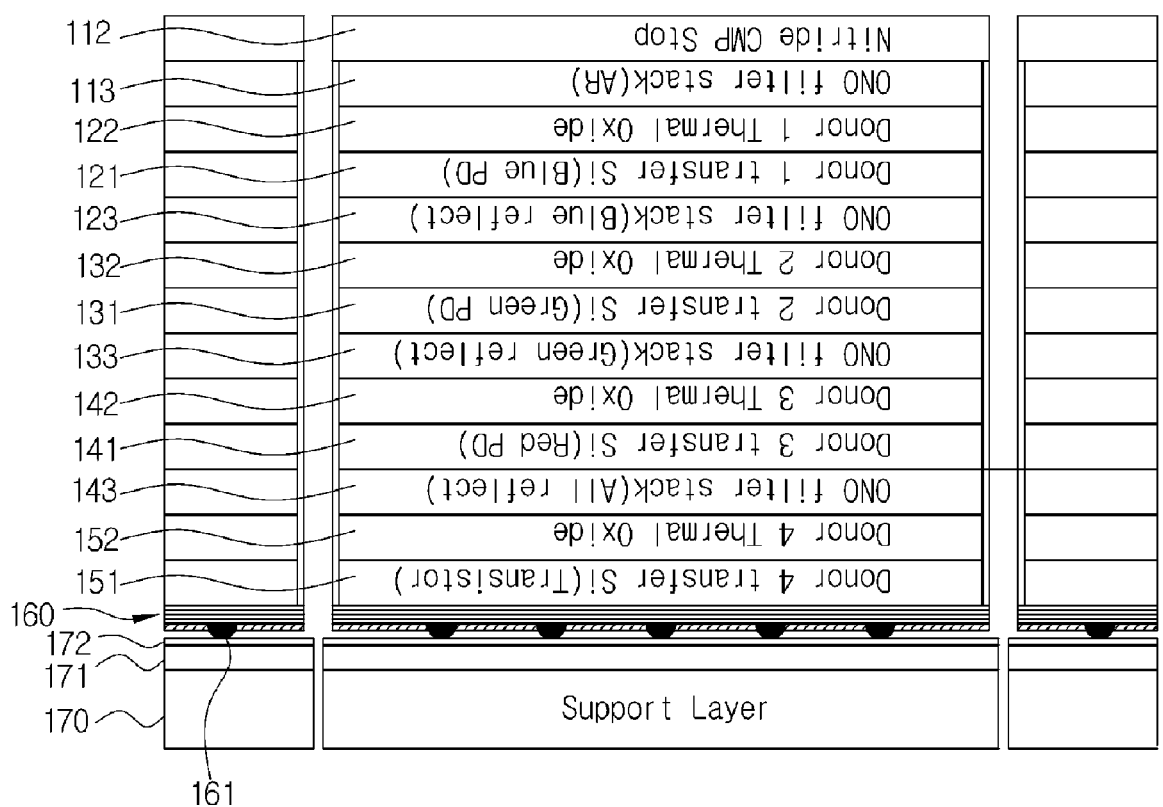
Figure 22:
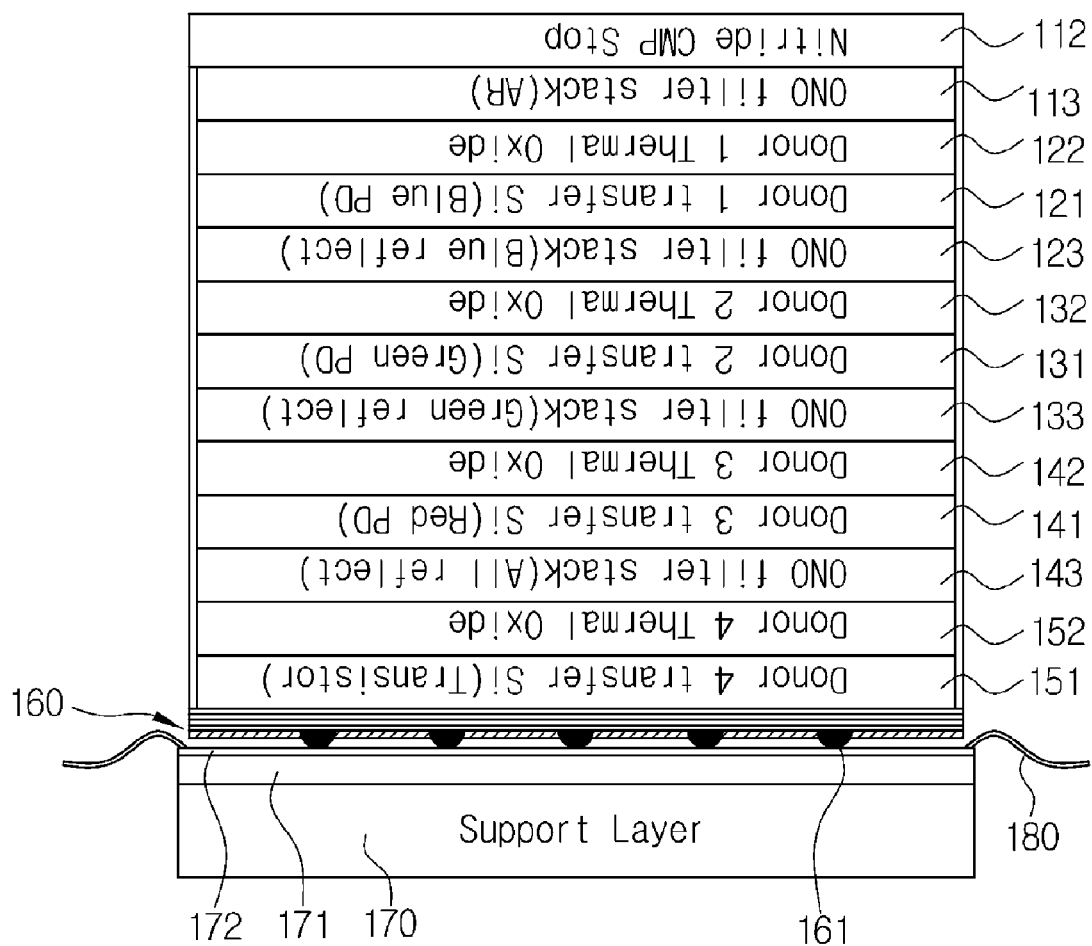

Referring to FIG. 21, a die is fully cut in order to form a bond shelf using another saw. Thereafter, one die is mounted using technology that is generally used in the semiconductor industry. There is shown in FIG. 22 the last die structure having bond wires 180.

Figure 23:
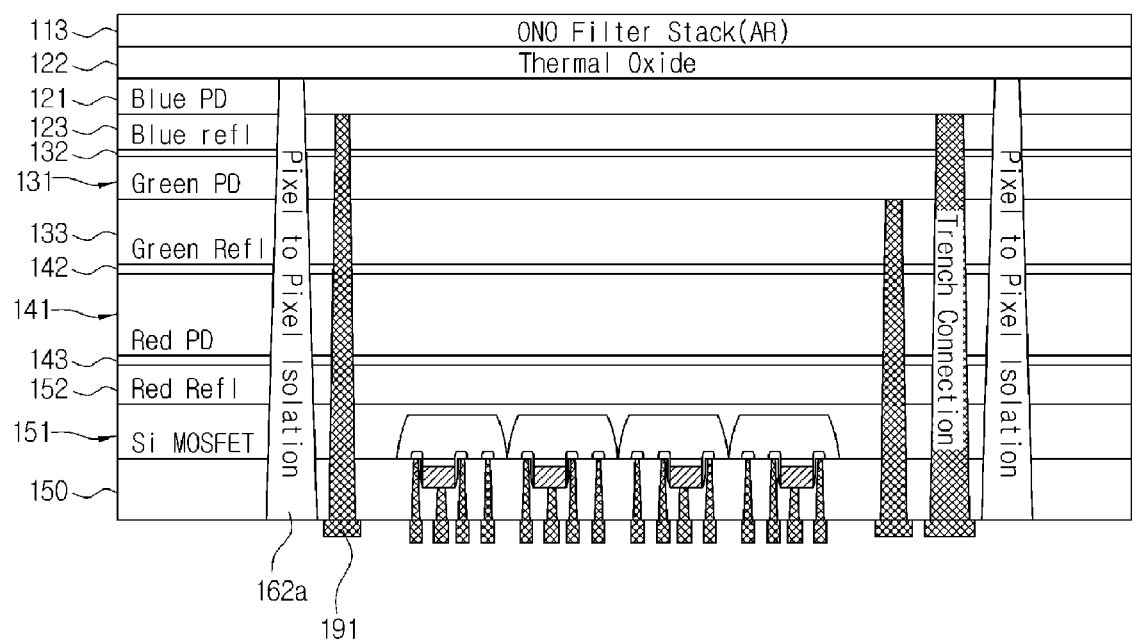
FIG. 23 is a cross-sectional view of a back illuminated three-dimensional multi-layer optical image sensor according to an embodiment of the present invention.

At this time, the dies are completely encapsulated and passivated. FIG. 23 is a cross-sectional view of a back illuminated three-dimensional multi-layer optical image sensor pixel according to an embodiment of the present invention.

As described above, the silicon/the dielectric layer of the multi-layer structure is formed on the handle wafer in a layer film transfer manner. After pixels are separated and the metal line and the contact of the device are formed, the device is turned over, thus completing the back illuminated device.

After the multi-layer semiconductor structure of the image sensor is fabricated, the support layer is adhered on the multi-layer semiconductor structure and is then packaged. In the drawing, the handle wafer is removed and the support layer is not shown. The image sensor has a structure in which a metal layer 160, a turned-over transistor layer 151, a thermal oxide film 152, an ONO dielectric layer 143 (i.e., a red reflect layer), a red diode layer 141, a thermal oxide film 142, an ONO dielectric layer 133 (i.e., a green reflect layer), a green diode layer 131, a thermal oxide film 132, an ONO dielectric layer 123 (i.e., a blue reflect layer), a blue diode layer 121, and a thermal oxide film 122 are sequentially laminated from a bottom, and an ONO dielectric layer (AR) 113 is formed on the thermal oxide film 122.

In FIG. 23, reference numeral 191 denotes a contact metal between the photodiode and the transistor, and 162a denotes an oxide film for pixel separation. The contact metal and the oxide film serve to divide the photodiodes, but are different from the vertical trenches for separating respective elements (chips).

Therefore, the image sensor according to an embodiment of the present invention has a structure in which the transistor layer is formed on a lower side and the red diode layer, the green diode layer, and the blue diode layer are formed on the transistor layer. Therefore, light irradiated from an upper side can be illuminated onto each diode layer without interference. Accordingly, the image sensor according to an embodiment of the present invention is advantageous in that the fill factor can be secured up to 93% as the back illuminated device of the multi-layer structure.

INDUSTRIAL APPLICABILITY

As described above in detail, a semiconductor device according to the present invention can provide a back illuminated sensor of a multi-layer silicon structure having a reflection layer between detecting layers. It is considered that the image sensor fabricated by the method according to the present invention is an almost optimal solution that can accomplish the above objects.

The process of the present invention may be used to fabricate a variety of sensors ranging from a general sensor to a high-performance optical sensor with less noise. The present invention is advantageous in that it can fabricate an electronic camera without a reduction in the fill factor or anti-blooming performance in the SLR sensor. The present invention is also advantageous in that it can couple a sensor to a digital processing chip while accomplishing a high degree of integration, low-power, and miniaturization in a bulky sensor.

Furthermore, the present invention is advantageous in that it can be applied to the fabrication of a sensor with a very small pixel. The present invention is also advantageous in that it can accomplish a high degree of video performance, which can be obtained only in a CCD, using the shuttering operation inherent in the sensor according to an embodiment of the present invention. In the process according to the present invention, genera silicon processing techniques, equipments, and factories are used without special equipment. This enables each process to be optimized and performed independently. This is because the formation of the photodiode, the connection and contact of the photodiode, the transistor process, and the metal stack process do not affect the other or are not coupled together.

It should be noted that the disclosure is not limited to the embodiment described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A method of fabricating a semiconductor device of a silicon and dielectric multilayer structure, the method comprising:
- a handle wafer preparation step of forming an etch-stop layer and a dielectric layer on a handle wafer;
- a donor wafer preparation step of forming an oxide layer and a semiconductor layer for the semiconductor device in a donor wafer, the semiconductor layer being formed below the oxide film, and preparing the donor wafer for layer transfer;
- a layer transfer step of turning over the donor wafer, bonding the turned-over donor wafer to a top surface of the handle wafer, and removing a silicon layer of the remaining donor wafer except for the semiconductor layer through layer transfer;
- a dielectric layer formation step of forming a dielectric layer on a top surface of the handle wafer after the layer transfer step;
- a multi-layer structure formation step of repeating the donor wafer preparation step, the layer transfer step, and the dielectric layer formation step, thus forming silicon/dielectric layers in a multi-layer structure;
- a pixel separation and contact step of forming the highest layer of the semiconductor layer as a transistor layer, completing transistors, allowing the transistors to bring in contact with semiconductor layers of an underlying multi-layer structure, separating pixels in the semiconductor layer of the multi-layer structure, and forming a metal layer and solder bumps on an upper surface;
- a support layer preparation step of preparing a support layer and forming an oxide film and a metal layer on the support layer in which circuits are patterned on the support layer;
- a support layer bonding step of turning over the support layer and aligning and bonding the solder bumps and the metal layer;
- and a handle wafer removing step of turning over the support layer so that the support layer is located at a lower side, etching the handle wafer using an etch-stop layer, removing the etch-stop layer, and then performing dicing and packaging;
- wherein in the semiconductor layer of the multi-layer structure, a transistor layer is formed at one or more photodiode layers and the highest layer, thus forming an image sensor.

2. The method of claim 1, wherein the handle wafer preparation step comprises a buffer oxide film formation step of forming a thick buffer oxide film in the handle wafer and forming a nitride film as the etch-stop layer on the buffer oxide film.

3. The method of claim 1, further comprising an edge sealing step after the support substrate bonding step.

4. The method of claim 1, wherein in the semiconductor device of the silicon and dielectric multi-layer structure, the semiconductor layer of the highest layer is formed to have a MOS semiconductor structure.

5. The method of claim 4, wherein the MOS semiconductor includes a transistor fabricated using a bulk semiconductor process.

6. The method of claim 4, wherein the MOS semiconductor includes a SOI Si transistor that is partially or entirely depleted.

7. The method of claim 4, wherein the MOS semiconductor includes a Junction Field Effect Transistor (JFET) that is isolated by dielectric.

8. The method of claim 4, wherein the MOS semiconductor includes either a Bipolar Junction Transistor (BJT) that is isolated by dielectric or a flip-fet transistor that is isolated by dielectric.

9. The method of claim 4, wherein the transistor includes a transistor having four kinds of terminals, including a source, a drain, a top side gate, and a back side gate.

10. The method of claim 1, wherein the donor wafer preparation step comprises forming the semiconductor layer by forming a diode layer on the donor wafer and implanting hydrogen ions at a predetermined depth under the oxide layer.

* * * * *